(12) United States Patent
Yamanaka et al.

(10) Patent No.: US 10,957,998 B2
(45) Date of Patent: Mar. 23, 2021

(54) PRESS-FIT TERMINAL, CONNECTOR FOR BOARD, AND BOARD-EQUIPPED CONNECTOR

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Takuya Yamanaka, Yokkaichi (JP); Kaori Shimizu, Yokkaichi (JP); Tetsuya Ito, Yokkaichi (JP); Takashi Tonosaki, Yokkaichi (JP); Tetsuya Shinozaki, Yokkaichi (JP); Shigeki Shimada, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/727,333

(22) Filed: Dec. 26, 2019

(65) Prior Publication Data

US 2020/0313320 A1 Oct. 1, 2020

(30) Foreign Application Priority Data

Mar. 28, 2019 (JP) .............................. JP2019-063994

(51) Int. Cl.
*H01R 12/58* (2011.01)
*H01R 13/03* (2006.01)
(Continued)

(52) U.S. Cl.
CPC .......... *H01R 12/585* (2013.01); *H01R 13/03* (2013.01); *H05K 1/18* (2013.01); *H05K 3/42* (2013.01); *H05K 2201/1059* (2013.01)

(58) Field of Classification Search
CPC ...... H01R 12/585; H01R 12/52; H01R 13/03; H01R 13/6595; H05K 1/18; H05K 3/42
(Continued)

(56) References Cited

U.S. PATENT DOCUMENTS 4,746,301 A * 5/1988 Key ....................... H01R 12/58
439/751
8,313,344 B2 * 11/2012 Johnescu ............. H01R 12/585
439/571

(Continued)

FOREIGN PATENT DOCUMENTS

JP 2008-165987 A 7/2008

*Primary Examiner* — Hien D Vu
(74) *Attorney, Agent, or Firm* — Oliff PLC

(57) ABSTRACT

An object is to, for physical properties, holding force, contact area, and insertion force in a trade-off relationship, set the holding force to 37 N or more, the contact area to 0.72 mm2 or more, and the insertion force to 90 N or less. A press-fit terminal is to be press-fitted into a through hole formed in a circuit board. A press-fit part includes a beam and an eye hole that is surrounded by the beam. The beam includes two parallel parts that are parallel to each other. In the press-fit part, G1/G2 is 0.20 or more and 1.05 or less where a front-side spring strength is G1 [mm3] and a rear-side spring strength is G2 [mm3] calculated under the following conditions, and G is 0.007 mm3 or more and 0.012 mm3 or less where a spring strength G [mm3] is G1+G2.

13 Claims, 8 Drawing Sheets

(51) Int. Cl.
*H05K 1/18* (2006.01)
*H05K 3/42* (2006.01)

(58) Field of Classification Search
USPC .................................................... 439/81, 82
See application file for complete search history.

(56) References Cited

U.S. PATENT DOCUMENTS

| | | | |
|---|---|---|---|
| 9,743,531 B2* | 8/2017 | Miyake | H01R 13/03 |
| 10,734,740 B2* | 8/2020 | Yamanaka | H01R 12/58 |

* cited by examiner

Table 1

| | | First example | Second example | Third example | First comparative example | Second comparative example | Third comparative example | Fourth comparative example | Fifth comparative example | Sixth comparative example | Seventh comparative example | Eighth comparative example | Ninth comparative example |
|---|---|---|---|---|---|---|---|---|---|---|---|---|---|
| Press-fit terminal | Thickness $t_1$ [mm] | 0.64 | 0.64 | 0.64 | 0.64 | 0.64 | 0.64 | 0.64 | 0.64 | 0.64 | 0.64 | 0.64 | 0.64 |
| | Thickness $t_2$ [mm] | 0.64 | 0.64 | 0.64 | 0.64 | 0.64 | 0.64 | 0.64 | 0.64 | 0.64 | 0.64 | 0.64 | 0.64 |
| | Spring thickness $h_1$ [mm] | 0.33 | 0.35 | 0.37 | 0.38 | 0.33 | 0.34 | 0.36 | 0.38 | 0.38 | 0.38 | 0.38 | 0.40 |
| | Spring thickness $h_2$ [mm] | 0.36 | 0.35 | 0.34 | 0.34 | 0.33 | 0.32 | 0.31 | 0.36 | 0.33 | 0.37 | 0.36 | 0.36 |
| | Chamfer $r$ [mm] | 0.25 | 0.25 | 0.25 | 0.25 | 0.25 | 0.25 | 0.25 | 0.25 | 0.25 | 0.25 | 0.25 | 0.25 |
| | Second moment of area $I_1$ [mm⁴] of front reference | 0.00145 | 0.00183 | 0.00205 | 0.00114 | 0.00143 | 0.00162 | 0.00181 | 0.00114 | 0.00229 | 0.00229 | 0.00252 | 0.00309 |
| | Second moment of area $I_2$ [mm⁴] of rear reference | 0.00189 | 0.00178 | 0.00164 | 0.00158 | 0.00146 | 0.00131 | 0.00118 | 0.00168 | 0.00146 | 0.00212 | 0.00199 | 0.00169 |
| | Front-side length $L_1$ [mm] of the press-fit part | 0.70 | 0.60 | 0.55 | 0.80 | 0.70 | 0.60 | 0.36 | 0.60 | 0.50 | 0.50 | 0.43 | 0.42 |
| | Rear-side length $L_2$ [mm] of the press-fit part | 0.28 | 0.30 | 0.32 | 0.33 | 0.35 | 0.38 | 0.41 | 0.27 | 0.35 | 0.26 | 0.27 | 0.28 |
| | Front-side spring strength $G_1$ [mm³] | 0.0021 | 0.0030 | 0.0037 | 0.0014 | 0.0021 | 0.0027 | 0.0033 | 0.0014 | 0.0046 | 0.0046 | 0.0056 | 0.0064 |
| | Rear-side spring strength $G_2$ [mm³] | 0.0068 | 0.0059 | 0.0051 | 0.0048 | 0.0042 | 0.0034 | 0.0029 | 0.0073 | 0.0042 | 0.0085 | 0.0073 | 0.0060 |
| | $G_1 + G_2$ [mm³] | 0.009 | 0.009 | 0.009 | 0.006 | 0.006 | 0.006 | 0.006 | 0.009 | 0.009 | 0.013 | 0.013 | 0.013 |
| Measurement results | Holding force [N] | 0.31 | 0.52 | 0.73 | 0.30 | 0.50 | 0.78 | 1.14 | 0.19 | 1.10 | 0.54 | 0.76 | 0.85 |
| | Contact area [mm²] | 37.9 | 38.9 | 40.7 | 33.6 | 34.1 | 36.0 | 35.5 | 37.1 | 41.0 | 45.9 | 47.5 | 49.0 |
| | | 0.78 | 0.81 | 0.83 | 0.69 | 0.72 | 0.75 | 0.76 | 0.71 | 0.82 | 0.87 | 0.89 | 0.94 |
| | Insertion force [N] | 78.7 | 83.3 | 85.6 | 69.9 | 67.6 | 77.4 | 79.3 | 82.1 | 91.9 | 94.8 | 101.2 | 105.3 |

FIG. 9

PRESS-FIT TERMINAL, CONNECTOR FOR BOARD, AND BOARD-EQUIPPED CONNECTOR

TECHNICAL FIELD

The present disclosure relates to a press-fit terminal, a connector for a board, and a board-equipped connector.

BACKGROUND ART

Japanese Unexamined Patent Application Publication No. 2008-165987 discloses a press-fit terminal that includes: an introduction portion formed at a tip of the press-fit terminal and to be introduced into a through hole in a circuit board; a pressure holding portion that is connected to the introduction portion and is press-fitted and held in the through hole; and a main body portion connected to the pressure holding portion, and has an opening extending in a longitudinal direction from a center of the pressure holding portion toward the main body portion and the introduction portion.

RELATED ART DOCUMENT

Patent Document

[Patent Document 1] Japanese Unexamined Patent Application Publication 2008-165987 A

SUMMARY OF THE INVENTION

Problem to be Solved by the Invention

In order to suppress the detachment of the press-fit terminal from the through hole due to an external force such as vibration, holding force of the press-fit terminal is preferably large. The holding force of the press-fit terminal is a load necessary to pull out the press-fit terminal, which is defined through a test of pulling out the press-fit terminal from the through hole.

In order to improve the reliability of electrical connection between the circuit board and the press-fit terminal, a contact area of the press-fit terminal is preferably large. The contact area of the press-fit terminal is an area where the inner surface of the through hole of the circuit board and the press-fit terminal come into contact when the press-fit terminal is inserted into the circuit board.

Further, in order to suppress damage to the circuit board during insertion of the press-fit terminal, insertion force of the press-fit terminal is preferably small. The insertion force of the press-fit terminal is a load necessary to insert the press-fit terminal into the through hole.

The holding force, the contact area, and the insertion force are in a trade-off relationship about the hardness of the press-fit part. Specifically, the harder the spring of the press-fit part is, the larger the holding force and the contact area can be, but the insertion force is increased. Further, the softer the spring of the press-fit part is, the smaller the insertion force can be, but the holding force and the contact area become smaller.

In addition, a hard spring means that the load required to narrow a press-fit part is large, and a soft spring means that the load required to narrow a press-fit part is small.

In recent years, press-fit terminals have been downsized, and there has been demand for a larger number of press-fit terminals to be mounted in one connector. This is because the number of signals exchanged in automobiles tends to increase with the progress of the electrification of the automobiles. Here, the load of arranging a connector on the circuit board simply takes on a value obtained by multiplying the insertion force of the press-fit terminal by the number of press-fit terminals arranged in one connector.

In order to easily arrange the connector on the circuit board, it is required to reduce the load of arranging the connector on the circuit board, though the number of terminals mounted in one connector is increased. Accordingly, it is required to reduce the insertion force of the press-fit terminal.

While the reduction of the insertion force is required, an improvement in holding force and contact area is also required at the same time.

The press-fit terminal is used, for example, for a control unit in an environment with a lot of vibration such as an engine room, and for a control unit that requires high reliability of electrical connection such as an airbag. Assuming that it is used for such applications, press-fit terminals are required to have improvement in holding force and contact area.

With a conventional press-fit terminal, for example, the holding force cannot be set to 37 N or more, the contact area to 0.72 mm$^2$ or more, and the insertion force to 90 N or less. However, in order to meet the demands of the automobile industry in recent years, it is required to satisfy the numerical values for the physical properties, holding force, contact area, and insertion force that are in a trade-off relationship.

Thus, an issue to be solved by the present disclosure is to, for the physical properties, holding force, contact area, and insertion force in a trade-off relationship, set the holding force to 37 N or more, the contact area to 0.72 mm$^2$ or more, and the insertion force to 90 N or less.

Means for Solving the Problem

The present disclosure is a press-fit terminal that is to be press-fitted into a through hole formed in a circuit board. A press-fit part includes a beam and an eye hole that is surrounded by the beam. The beam includes two parallel parts that are parallel to each other. In the press-fit part, $G_1/G_2$ is 0.20 or more and 1.05 or less where a front-side spring strength is $G_1$ [mm$^3$] and a rear-side spring strength is $G_2$ [mm$^3$] calculated under the following conditions, and G is 0.007 mm$^3$ or more and 0.012 mm$^3$ or less where a spring strength G [mm$^3$] is $G_1+G_2$:

(Conditions)

An insertion direction in which the press-fit terminal is inserted into the through hole is defined as a forward direction, and a direction opposite to the insertion direction is defined as a rear direction.

A position 0.1 mm backward from a front end of the eye hole is defined as a front reference, and a position 0.1 mm forward from a rear end of the eye hole is defined as a rear reference.

A length of a perpendicular line $P_1$ from the front reference to an outer edge of the beam is defined as a spring thickness $h_1$ [mm], and a length of a perpendicular line $P_2$ from the rear reference to the outer edge of the beam is defined as a spring thickness $h_2$ [mm].

A thickness of the press-fit terminal at the front reference is defined as a plate thickness $t_1$ [mm], and a thickness of the press-fit terminal at the rear reference is defined as a plate thickness $t_2$ [mm].

When the beam is viewed in cross section, an R chamfer of the outer edge of the beam has a radius r [mm].

Second moment of area I of the front reference calculated by the following (equation) with $t=t_1$ and $h=h_1$ is defined as $I_1$ [mm$^4$].
Second moment of area I of the rear reference calculated by the following (Equation) with $t=t_2$ and $h=h_2$ is defined as $I_2$ [mm$^4$].

[Equation 1]

$$\text{(Equation) } I = \left(k - \frac{h-r}{2}\right)^2 t(h-r) + \frac{t(h-r)^3}{12} + \left[k - \left\{(h-r) + \frac{r}{2}\right\}\right]^2 (t-2r)r +$$
$$\frac{(t-2r)r^3}{12} + \left[k - \left\{(h-r) + \frac{4r}{3\pi}\right\}\right]^2 \frac{\pi r^2}{2} + \frac{r^4(9\pi^2 - 64)}{72\pi}$$

where $$k = \frac{t(h-r)\frac{h-r}{2} + (t-r)r\left\{(h-r) + \frac{r}{2}\right\} + \frac{\pi r^2}{2}\left\{(h-r) + \frac{4r}{3\pi}\right\}}{(h-r)t + (t-2r)r + \frac{\pi r^2}{2}}$$

A length as seen in the insertion direction from an intersection of a straight line extended from an intersection of the perpendicular line $P_1$ and the outer edge of the beam in a direction perpendicular to the perpendicular line $P_1$ and a straight line extended along an outer edge of the parallel parts to the front end of the eye hole is defined as $L_1$ [mm].

A length as seen in the insertion direction from an intersection of a straight line extended from an intersection of the perpendicular line $P_2$ and the outer edge of the beam in a direction perpendicular to the perpendicular line $P_2$ and a straight line extended along an outer edge of the parallel parts to the rear end of the eye hole is defined as $L_2$ [mm].

The front-side spring strength $G_1$ is defined as $I_1/L_1$ [mm$^3$], and the rear-side spring strength $G_2$ is defined as $I_2/L_2$ [mm$^3$].

Advantageous Effects of Invention

According to the present disclosure, it is possible to provide a press-fit terminal in which, for the physical properties, holding force, contact area, and insertion force in a trade-off relationship, the holding force is set to 37 N or more, the contact area to 0.72 mm$^2$ or more, and the insertion force to 90 N or less.

BRIEF DESCRIPTION OF THE DRAWINGS

FIG. 9 shows examples and comparative examples of press-fit terminals and measurement results.

MODE FOR CARRYING OUT THE INVENTION

Figure 1:
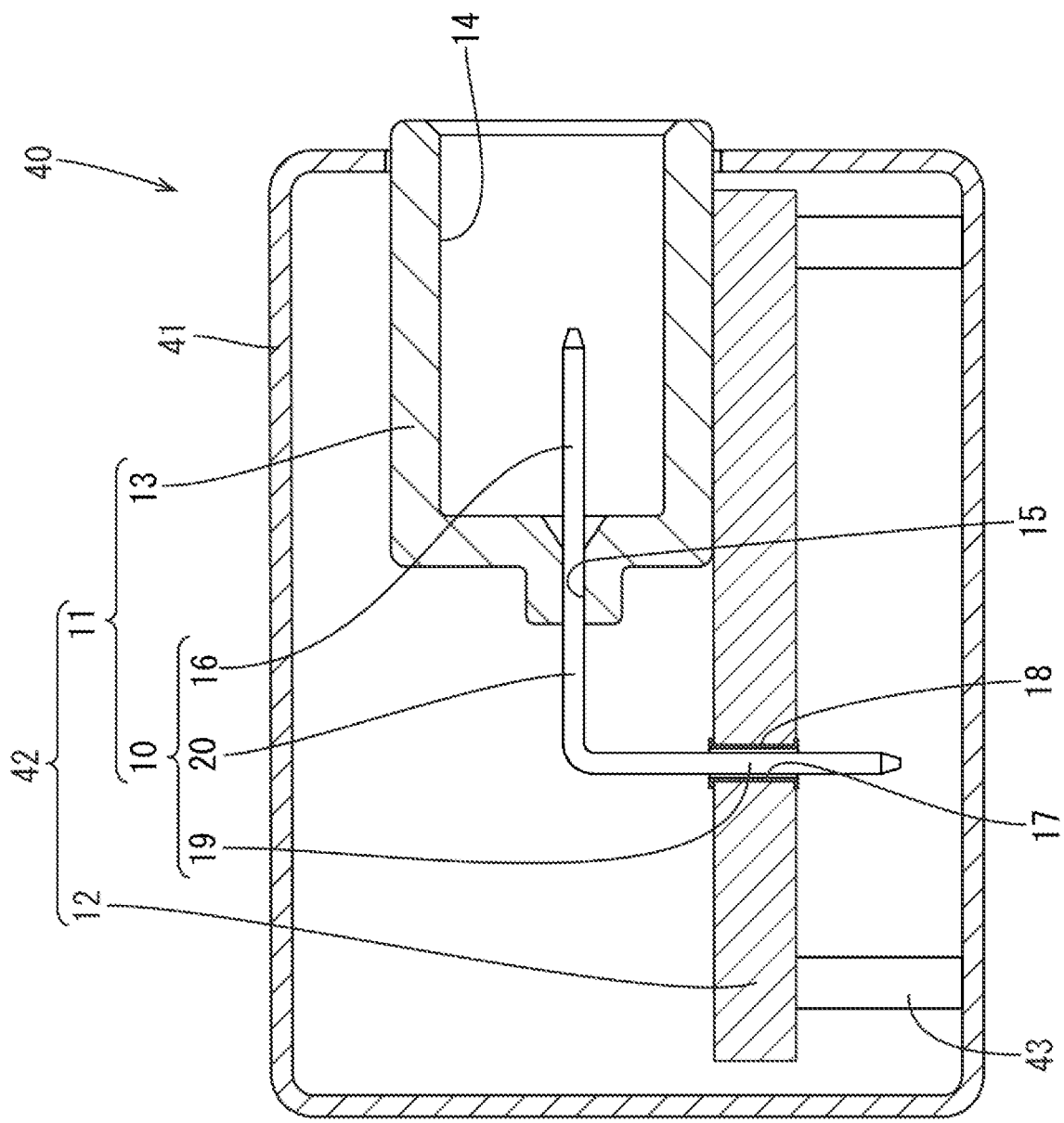
FIG. 1 is a side sectional view of a control unit including a board-equipped connector according to the present embodiment.

Description of Embodiment of the Present Disclosure

First, embodiments of the present disclosure will be listed and described.

(1) The present disclosure is a press-fit terminal that is to be press-fitted into a through hole formed in a circuit board. A press-fit part includes a beam and an eye hole that is surrounded by the beam. The beam includes two parallel parts that are parallel to each other. In the press-fit part, $G_1/G_2$ is 0.20 or more and 1.05 or less where a front-side spring strength is $G_1$ [mm$^3$] and a rear-side spring strength is $G_2$ [mm$^3$] calculated under the following conditions, and G is 0.007 mm$^3$ or more and 0.012 mm$^3$ or less where a spring strength G [mm$^3$] is $G_1+G_2$:

(Conditions)

An insertion direction in which the press-fit terminal is inserted into the through hole is defined as a forward direction, and a direction opposite to the insertion direction is defined as a rear direction.

A position 0.1 mm backward from a front end of the eye hole is defined as a front reference, and a position 0.1 mm forward from a rear end of the eye hole is defined as a rear reference.

A length of a perpendicular line $P_1$ from the front reference to an outer edge of the beam is defined as a spring thickness $h_1$ [mm], and a length of a perpendicular line $P_2$ from the rear reference to the outer edge of the beam is defined as a spring thickness $h_2$ [mm].

A thickness of the press-fit terminal at the front reference is defined as a plate thickness $t_1$ [mm], and a thickness of the press-fit terminal at the rear reference is defined as a plate thickness $t_2$ [mm].

When the beam is viewed in cross section, an R chamfer of the outer edge of the beam has a radius r [mm].

Second moment of area I of the front reference calculated by the following (equation) with $t=t_1$ and $h=h_1$ is defined as $I_1$ [mm$^4$].

Second moment of area I of the rear reference calculated by the following (Equation) with $t=t_2$ and $h=h_2$ is defined as $I_2$ [mm$^4$].

[Equation 2]

$$\text{(Equation) } I = \left(k - \frac{h-r}{2}\right)^2 t(h-r) + \frac{t(h-r)^3}{12} + \left[k - \left\{(h-r) + \frac{r}{2}\right\}\right]^2 (t-2r)r +$$
$$\frac{(t-2r)r^3}{12} + \left[k - \left\{(h-r) + \frac{4r}{3\pi}\right\}\right]^2 \frac{\pi r^2}{2} + \frac{r^4(9\pi^2 - 64)}{72\pi}$$

where $$k = \frac{t(h-r)\frac{h-r}{2} + (t-r)r\left\{(h-r) + \frac{r}{2}\right\} + \frac{\pi r^2}{2}\left\{(h-r) + \frac{4r}{3\pi}\right\}}{(h-r)t + (t-2r)r + \frac{\pi r^2}{2}}$$

A length as seen in the insertion direction from an intersection of a straight line extended from an intersection of the perpendicular line $P_1$ and the outer edge of the beam in a direction perpendicular to the perpendicular line $P_1$ and a straight line extended along an outer edge of the parallel parts to the front end of the eye hole is defined as $L_1$ [mm].

A length as seen in the insertion direction from an intersection of a straight line extended from an intersection of the perpendicular line $P_2$ and the outer edge of the beam in a direction perpendicular to the perpendicular line $P_2$ and a straight line extended along an outer edge of the parallel parts to the rear end of the eye hole is defined as $L_2$ [mm].

The front-side spring strength $G_1$ is defined as $I_1/L_1$ [mm³], and the rear-side spring strength $G_2$ is defined as $I_2/L_2$ [mm³].

The inventors of the present invention discovered that, with the conventional shape of the press-fit terminal, it is not possible to, for the physical properties, holding force, contact area, and insertion force in a trade-off relationship, set the holding force to 37 N or more, the contact area to 0.72 mm² or more, and the insertion force to 90 N or less. Therefore, the inventors of the present invention examined the design factor of the press-fit terminal so that the holding force, the contact area, and the insertion force all satisfy desired values. As a result, the inventors of the present invention considered adopting an index of "spring strength" as an index of the difficulty of bending the beam to form the press-fit part.

The spring strength is a value obtained by dividing the second moment of area of the beam by the length of the beam in consideration of the shape of the fillet. Thus, "spring strength" can be understood as second moment of area taking into account the factor that the press-fit part becomes soft when the beam is long and the press-fit part becomes hard when the beam is short. Conventionally, the fillet form factor has not been counted in the calculation of the second moment of area of the beam. However, the inventors of the present invention have considered that, as the press-fit terminal is downsized, the influence of the fine shape of the fillet on the difficulty of bending the press-fit terminal increases, and have contemplated introducing the fillet form factor into the calculation of the spring strength.

The inventors of the present invention have considered setting the position where to calculate the second moment of area for calculating the spring strength of the press-fit part in such a manner as to be separated from the end of the eye hole by a specific distance. Then, the inventors of the present invention have divided the second moments of area $I_1$ and $I_2$ by the length of the press-fit part, thereby to set the front-side spring strength $G_1$ and the rear-side spring strength $G_2$ respectively corresponding to the strengths of the front and rear sides of the press-fit part. Then, the inventors of the present invention have discovered that all the holding force, the contact area, and the insertion force can satisfy desired values by setting $G_1/G_2$ estimated to correspond to the front-side spring strength to the rear-side spring strength to 0.20 or more and 1.05 or less and setting $G_1+G_2$ estimated to correspond to the spring strength of the entire press-fit part to 0.007 mm³ or more and 0.012 mm³ or less, thereby completing the invention of the present application.

(2) The press-fit terminal is preferably used for a signal circuit. A terminal used for a signal circuit is thinner and smaller than a terminal used for a power circuit. Such a thin and small terminal used for a signal system circuit makes a greater contribution of the fillet form factor to the spring strength than that of the terminal used for a power circuit. Thus, it is possible to achieve desired holding force, contact area, and insertion force by setting $G_1/G_2$ and $G_1+G_2$ in appropriate ranges at the terminal used for the signal circuit.

(3) The plate thickness $t_1$ is preferably 0.5 mm or more to 0.7 mm or less, and the plate thickness $t_2$ is preferably 0.5 mm or more to 0.7 mm or less.

When the plate thickness $t_1$ and the plate thickness $t_2$ are 0.5 mm or more, the front-side spring strength $G_1$ and the rear-side spring strength $G_2$ increase. This is preferable because the holding force and the contact area can be adjusted to desired numerical ranges. When the plate thickness $t_1$ and the plate thickness $t_2$ are 0.7 mm or less, the front-side spring strength $G_1$ and the rear-side spring strength $G_2$ decrease. This is preferable because the insertion force can be adjusted to a desired numerical range.

(4) The thickness of the press-fit terminal is preferably 0.5 mm or more and 0.7 mm or less.

Recently, electrical components mounted in vehicles have been highly electronically controlled. For this reason, the amount of signals in communication within a vehicle tends to increase more and more. On the other hand, electric components mounted in vehicles are required to be lightweighted and downsized. For this reason, the connector for communicating a signal in a vehicle and the press-fit terminal disposed on the connector are required for further miniaturization and high density. With a thickness of 0.5 mm or more and 0.7 mm or less, the press-fit terminal can be suitably used for a signal circuit mounted in a vehicle.

(5) Of the press-fit part, it is preferable that a portion surrounding the eye hole is not chamfered.

The second moment of area of the present disclosure is based on the premise that, when the beam is viewed in cross section, the outer edge of the beam is round chamfered and the part of the beam surrounding the eye hole is not chamfered. Since the part of the beam surrounding the eye hole is not chamfered, the holding force, the contact area, and the insertion force can be preferably set to desired values.

(6) $W_2/W_1$ is preferably greater than 0.25 and 0.35 or less where the width of the press-fit part is $W_1$ [mm] and the width of the eye hole is $W_2$ [mm].

Setting $W_2/W_1$ to be greater than the above lower limit would make the press-fit part flexible. This is preferable from the viewpoint of reducing the insertion force within a desired numerical range.

Setting $W_2/W_1$ to be less than or equal to the above upper limit would make the press-fit part hardened. This is preferable from the viewpoint of improving the holding force and the contact area within a desired numerical range.

Note that $W_1$ and $W_2$ are respectively intended to be the lengths at the positions where the widths of the press-fit part and the eye hole are maximum. The width is intended to be the length along the direction perpendicular to the insertion direction.

(7) The tip of the press-fit terminal preferably has a tapered shape. Thereby, even when there is a dimensional error of the connector and a dimensional error of the through hole, the press-fit terminal can be inserted into the circuit board along the tapered shape. This is preferable from the viewpoint of suppressing an increase in the insertion force due to a dimensional error at mass production of the board connector.

(8) The connector for a board according to the present disclosure includes the press-fit terminal according to the present disclosure and a connector in which the press-fit terminal is disposed.

(9) The pitch interval of the press-fit terminals is preferably greater than 2.0 mm and 3.0 mm or less.

When the press-fit terminal is inserted, the circuit board becomes damaged. The damage is, for example, delamination of layers constituting the circuit board. When the layers are greatly delaminated, the circuits at close positions are short-circuited at high humidity, for example, and the insulation performance of the circuit board is lowered. Setting the pitch interval to be greater than the lower limit would reduce the delamination distance with respect to the distance between adjacent through holes. This is preferable from the viewpoint of, even if delamination of layers occurs, suppressing a decrease in the insulation performance of the circuit board. The layers of the circuit board are intended to be the layers of materials, such as copper foil, glass fiber, and insulating resin.

Setting the pitch interval to be equal to or less than the above upper limit is preferable from the viewpoint of reducing the size of the connector even with an increase in the number of poles of terminals in the connector.

(10) $W_1/\varphi$ is preferably 1.05 or more and 1.35 or less where the width of the press-fit part is $W_1$ [mm] and the diameter of the through hole is $\varphi$ [mm].

When the ratio $W_1/\varphi$ of the width $W_1$ of the press-fit part to the diameter $\varphi$ of the through hole is 1.05 or more, it is possible to improve the frequency with which the press-fit part contacts the eye hole. This is preferable from the viewpoint of improving the holding force and the contact area within a desired numerical range.

When the ratio $W_1/\varphi$ of the maximum width $W_1$ of the press-fit part to the diameter $\varphi$ of the through hole is 1.35 or less, it is possible to decrease the frequency with which the press-fit part contacts the eye hole. This is preferable from the viewpoint of reducing the insertion force within a desired numerical range.

(11) The number of poles of the connector is preferably 20 or more.

As described above, the number of signals in the automobile is increasing by highly-advanced electronic control. As a result, there is an increasing demand for a larger number of terminals that is used in the connector. The press-fit terminal of the present disclosure can reduce the insertion force while improving the holding force and the contact area. Accordingly, the connector of the present disclosure is preferable from the viewpoint of easy arrangement of the connector on the circuit board even with as a large number of poles as 20 or more.

(12) The connector for a board according to the present disclosure is preferably used for a control unit. In recent years, the number of poles of a terminal in a connector for board used in a control unit has increased with an increase in the number of signals. As a result, the insertion force for inserting the connector for board into the circuit board is unfavorably increased. However, the press-fit terminal according to the present embodiment allows reduction in the insertion force. Accordingly, it is preferable from the viewpoint of reducing the insertion force even when the number of terminal poles of the connector increases.

(13) A board-equipped connector according to the present disclosure includes the connector for a board according to the present disclosure and a circuit board.

As described above, recently, in vehicles, the number of signals to be communicated has increased, and miniaturization of parts has been required. For this reason, the circuit board is required to have a high-density conductive pattern. In order to increase the density of the conductive pattern, it is necessary to reduce the pitch of the through holes. Since the insertion force of the press-fit terminal according to the present disclosure is reduced, it is possible to improve workability in installing the connector for a board on the circuit board even when the conductive pattern of the circuit board is narrowed.

Details of Embodiment of the Present Disclosure

Hereinafter, embodiments of the present disclosure will be described. The present disclosure is not limited to these exemplifications, but is defined by the claims, and is intended to include meanings equivalent to the claims and all modifications within the scope of the claims.

A press-fit terminal 10, a connector 11 for a board, and a board-equipped connector 42 according to an embodiment of the present disclosure (hereinafter, the present embodiment) will be described with reference to FIGS. 1 to 8. In the following description, for a plurality of identical members, a reference numeral may be given to only some of them and may be omitted for the others.

[Board-Equipped Connector 42]

Figure 2:
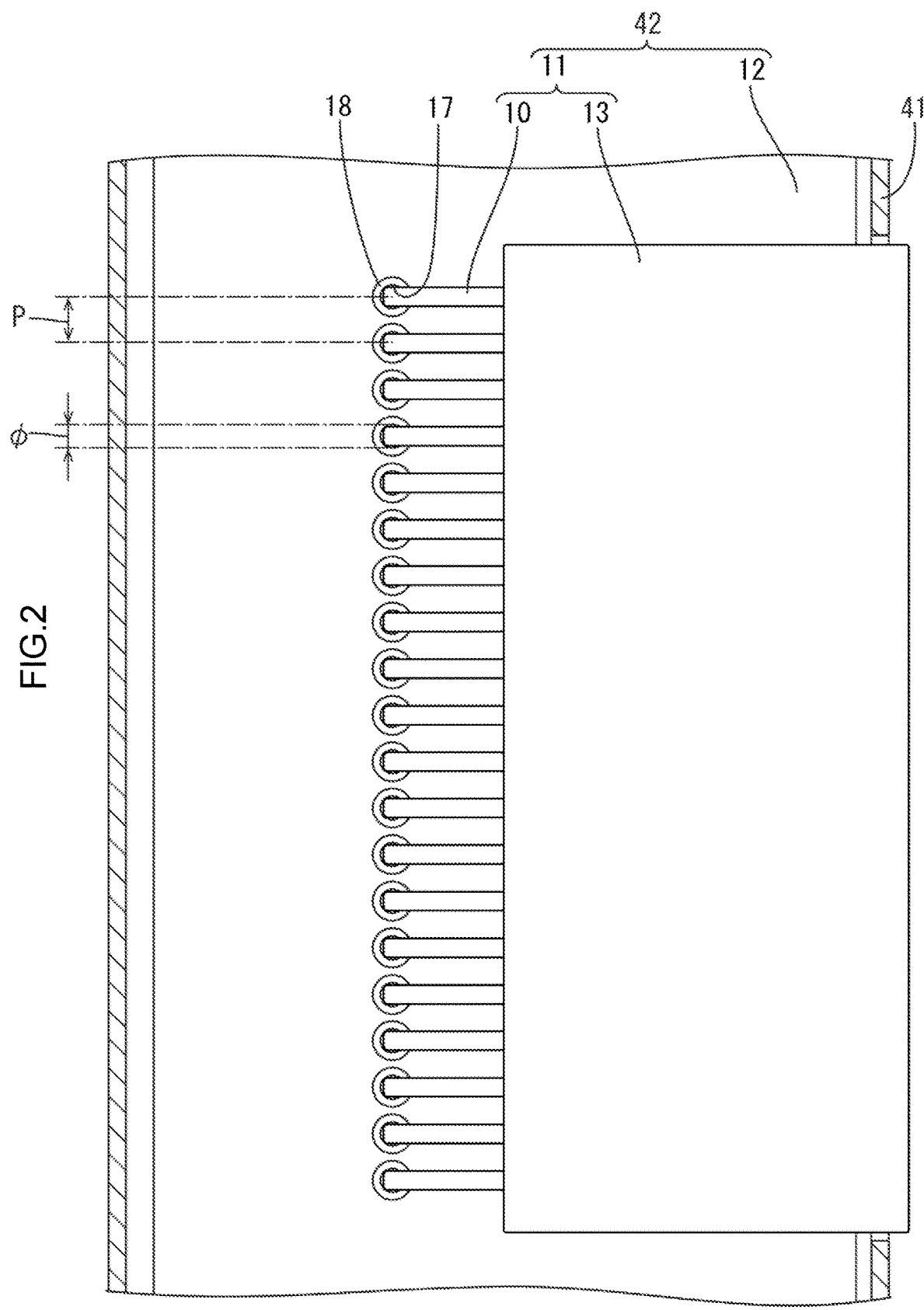
FIG. 2 is a plan view of a board-equipped connector according to the present embodiment.

As shown in FIGS. 1 and 2, the board-equipped connector of the present embodiment includes a connector 11 for a board and a circuit board 12.

[Intended Use]

The board-equipped connector 42 according to the present embodiment is used in a control unit 40 for automobiles. Examples of the control unit 40 include a rear light control unit, an airbag control unit, an engine control unit, and a body control module (BCM).

As shown in FIG. 1, the control unit 40 includes, for example, a case 41 and the board-equipped connector 42.

The case 41 includes bosses 43. The board-equipped connector 42 is fixed by screwing the circuit board 12 to the bosses 43, for example.

[Connector 11 for Board]

The connector 11 for a board according to the present embodiment includes a press-fit terminal 10 and a connector 13.

The connector 13 is, for example, an injection molded body formed by injection molding.

The connector 13 includes, for example, a hood part 14 and a terminal press-fit hole 15.

The hood part 14 accommodates the mating connector and connects the connectors together.

The terminal press-fit hole 15 is a hole into which the press-fit terminal 10 is to be press-fitted.

[Press-Fit Terminal 10]

The press-fit terminal 10 according to the present embodiment includes a mating part 16, a press-fit part 19, a connecting part 20, and a tapered part 25.

[Mating Part 16]

The mating part 16 is a part where the press-fit terminal 10 is electrically connected to another terminal. The shape of the mating part 16 can be, for example, a plate-like male terminal shape.

[Press-Fit Part 19]

Figure 5:
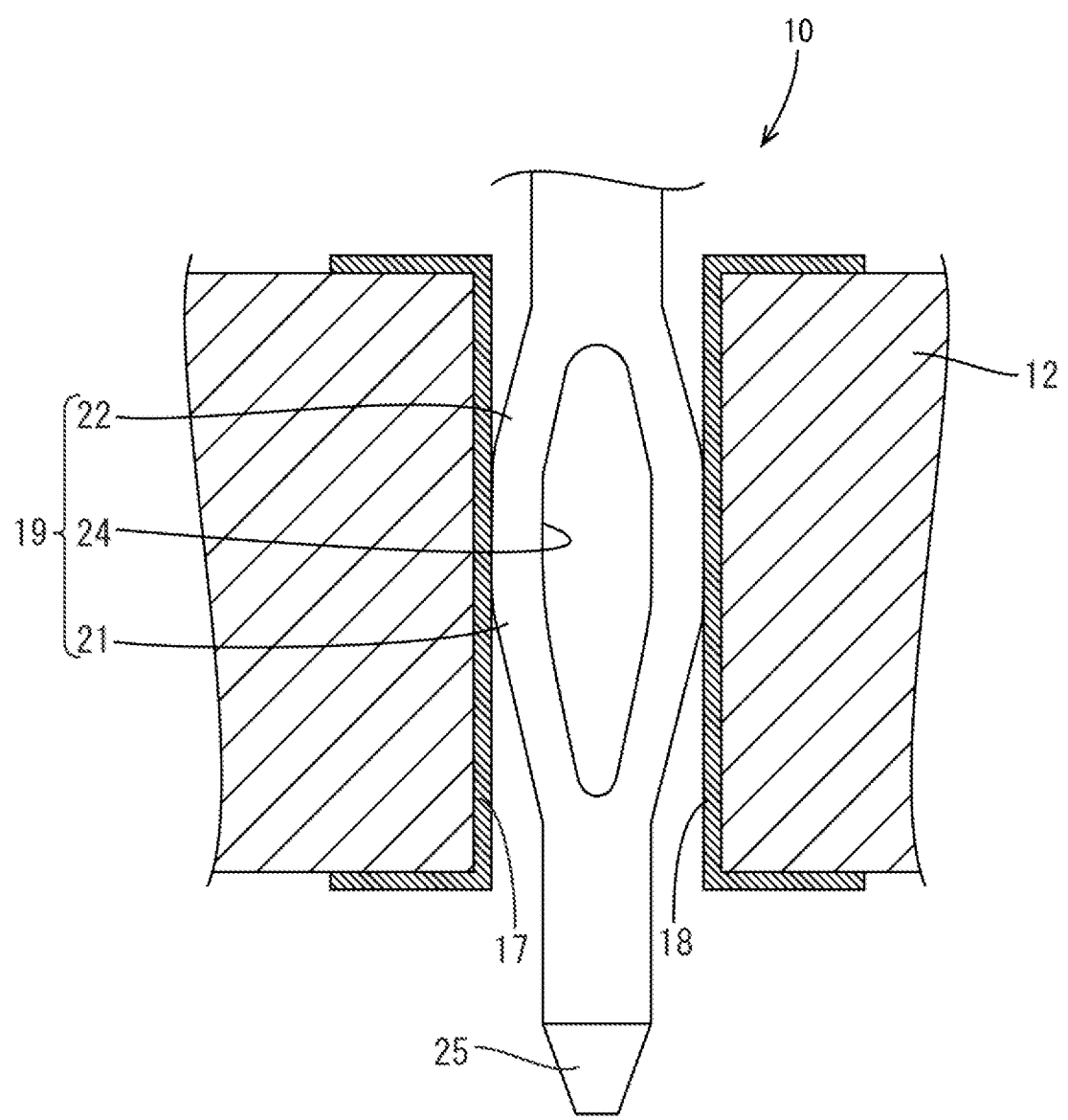
FIG. 5 is a cross-sectional view of the press-fit terminal that is inserted into a through hole according to the present embodiment.

The press-fit part 19 is a part that is inserted into a through hole 17 of the circuit board 12 and is electrically connected to the circuit board 12. As shown in FIG. 5, a conductive part 18 is provided on the inner periphery of the through hole 17 and is electrically connected to the press-fit part 19. Thereby, the contact area mentioned above contributes to the reliability of electrical connection.

In the present embodiment, the diameter of the through hole 17 is not limited, but may be, for example, 0.94 mm or more and 1.09 mm or less. In the present embodiment, the diameter of the through hole 17 is also defined as the width of the through hole 17.

Figure 3:
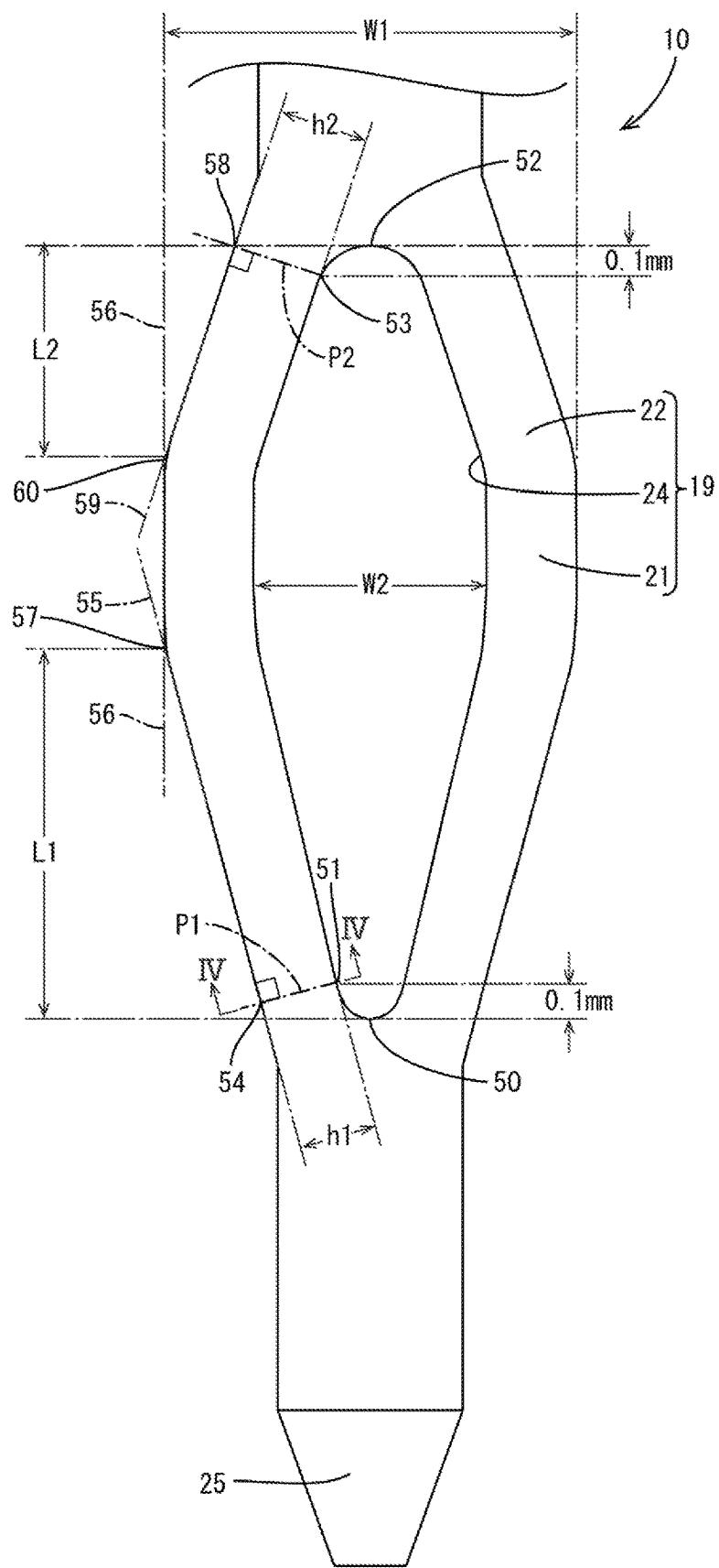
FIG. 3 is an enlarged plan view of a press-fit part in a press-fit terminal according to the present embodiment.

As shown in FIG. 3, the press-fit part 19 is constituted by a beam 22.

The beam 22 forms an eye hole 24 that is a closed slit. The deformation of the eye hole 24 allows the press-fit terminal 10 to be inserted into the through hole 17 or come into contact with the circuit board 12 to form an electrical connection.

The beam 22 according to the present embodiment includes two parallel parts 21 that are parallel to each other. Controlling the shape factor of the beam 22 connected to the parallel parts 21 allows the press-fit terminal 10 according to the present embodiment to have all the holding force, the contact area, and the insertion force within desired ranges.

[Connecting Part 20]

The connecting part 20 is a part that connects the mating part 16 and the press-fit part 19.

[Tapered Part 25]

The tapered part 25 is provided at the tip of the press-fit terminal 10 that is inserted into the through hole 17. The shape of the tapered part 25 can be, for example, a shape decreased in thickness or width toward the tip.

[Method for Calculating the Front-Side Spring Strength $G_1$ and the Rear-Side Spring Strength $G_2$]

Hereinafter, a method for calculating the front-side spring strength $G_1$ and the rear-side spring strength $G_2$ will be described with reference to FIGS. 3 and 4.

As a premise, the insertion direction in which the press-fit terminal 10 is inserted into the through hole 17 is the forward direction. In addition, the direction opposite to the insertion direction is the rear direction.

<Front Reference 51 and Rear Reference 53>

As shown in FIG. 3, a position 0.1 mm backward from a front end 50 of the eye hole 24 is defined as front reference 51. Here, 0.1 mm is 0.1 mm backward, not along the edge of the eye hole 24. Similarly, a position 0.1 mm forward from a rear end 52 of the eye hole 24 is defined as rear reference 53.

<Second Moment of Area $I_1$ of the Front Reference 51>

As shown in FIG. 3, a perpendicular line $P_1$ from the front reference 51 to the outer edge of the beam is assumed. The second moment of area in the cross section of the beam 22 along the perpendicular line $P_1$ is the second moment of area $I_1$ [mm$^4$] of the front reference.

Here, FIG. 4 as a cross section view of FIG. 3 taken along with line IV-IV will be discussed. As shown in FIG. 4, a length h of the perpendicular line $P_1$ is defined as spring thickness $h_1$ [mm], and a plate thickness t of the press-fit terminal 10 in the front reference 51 is defined as $t_1$ [mm].

Figure 4:
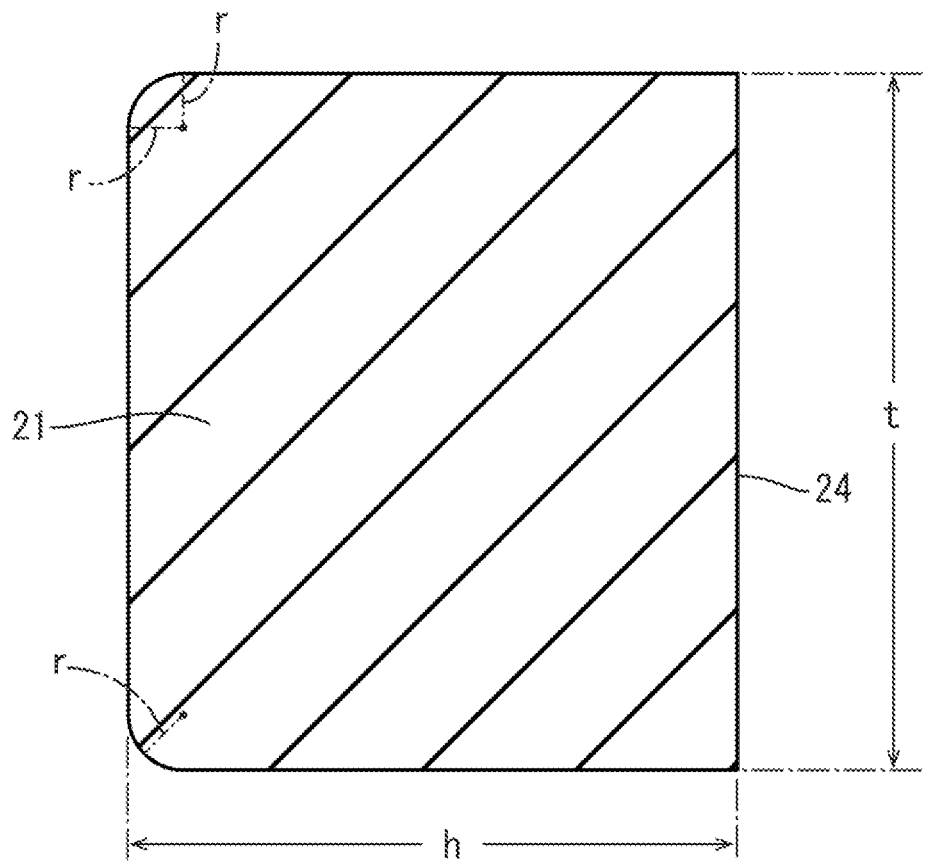
FIG. 4 is a cross-sectional view of FIG. 3 taken along line IV-IV.

In addition, as shown in FIG. 4, a radius c of R chamfer in the outer edge of the beam in the cross section of the beam 22 along the perpendicular line $P_1$ is defined as radius r [mm]. The radius r [mm] can also be defined as the radius of curvature of the chamfered corner illustrated in FIG. 4, for example.

The second moment of area $I_1$ [mm$^4$] of the front reference can be calculated by the following (Equation) where $t=t_1$ [mm], $h=h_1$ [mm], and $r=r$ [mm].

[Equation 3]

$$\text{(Equation) } I = \left(k - \frac{h-r}{2}\right)^2 t(h-r) + \frac{t(h-r)^3}{12} + \left[k - \left\{(h-r) + \frac{r}{2}\right\}\right]^2 (t-2r)r +$$

-continued $$\frac{(t-2r)r^3}{12} + \left[k - \left\{(h-r) + \frac{4r}{3\pi}\right\}\right]^2 \frac{\pi r^2}{2} + \frac{r^4(9\pi^2 - 64)}{72\pi}$$

where $$k = \frac{t(h-r)\frac{h-r}{2} + (t-r)r\left\{(h-r) + \frac{r}{2}\right\} + \frac{\pi r^2}{2}\left\{(h-r) + \frac{4r}{3\pi}\right\}}{(h-r)t + (t-2r)r + \frac{\pi r^2}{2}}$$

<Second Moment of Area $I_2$ of the Rear Reference 53>

In the same manner as the second moment of area $I_1$ of the front reference 51, the second moment of area $I_2$ of the rear reference 53 is calculated.

As shown in FIG. 3, a perpendicular line $P_2$ from the rear reference 53 to the outer edge of the beam is assumed. The second moment of area in the cross section of the beam along the perpendicular line P2 is the second moment of area $I_2$ [mm$^4$] of the rear reference 53.

As in the case of obtaining the second moment $I_1$ of the front reference 51, the length h of the perpendicular line $P_2$ in the cross section of the beam along the perpendicular line $P_2$ is defined as spring thickness $h_2$ [mm], and the plate thickness t of the press-fit terminal 10 is defined as $t_2$ [mm], and a R chamfer of the outer edge of the beam in the cross section of the beam along the perpendicular line $P_2$ has a radius r [mm].

The second moment of area $I_2$ [mm$^4$] of the front reference can be calculated by the following (equation) where $t=t_2$ [mm], $h=h_2$ [mm], and $r=r$ [mm].

<Front-Side Spring Strength $G_1$>

The front-side spring strength $G_1$ is calculated from the second moment $I_1$ of the front reference obtained by the above method.

As a premise, an intersection 57 of a straight line 55 extending in a direction perpendicular to the perpendicular line $P_1$ from an intersection 54 of the perpendicular line $P_1$ and the outer edge of the beam and a straight line 56 extending along the outer edge of the parallel parts 21 is defined. The length from the intersection 57 to the front end 50 of the eye hole 24 as seen from the insertion direction is defined as $L_1$ [mm]. The length $L_1$ is intended to be the length of the front side of the press-fit part 19.

From the length $L_1$, the front-side spring strength $G_1$ is calculated as $I_1/L_1$ [mm$^3$].

<Rear-Side Spring Strength $G_2$>

The rear-side spring strength $G_2$ is calculated from the second moment $I_2$ of the rear reference obtained by the above method.

As a premise, an intersection 60 of a straight line 59 extending in a direction perpendicular to the perpendicular line $P_2$ from an intersection 58 of the perpendicular line $P_2$ and the outer edge of the beam and a straight line 56 extending along the outer edge of the parallel parts 21 is defined. The length from the intersection 60 to the rear end 52 of the eye hole 24 as seen from the insertion direction is defined as $L_2$ [mm]. The length $L_2$ is intended to be the length of the rear side of the press-fit part 19.

From the length $L_2$, the rear-side spring strength $G_2$ is calculated as $I_2/L_2$ [mm$^3$].

[Material of the Press-Fit Terminal 10]

As the base material of the press-fit terminal 10, for example, a metal material such as copper or copper alloy can be selected.

The surface of the base material of the press-fit terminal 10 may be plated, for example.

The plating is made of a metal such as tin, nickel, copper, or zinc, for example.

[Method for Manufacturing the Press-Fit Terminal 10]

Although the method for manufacturing the press-fit terminal 10 is not limited, the press-fit terminal 10 can be manufactured by press working, for example.

First, the press-fit terminal 10 can be created by punching a plate material to produce the outer shape of the press-fit terminal 10 and then bending the connecting part 20 into a desired shape.

[Intended Use of the Press-Fit Terminal 10]

The press-fit terminal 10 can be preferably used as a connector terminal for connecting circuit boards, that is, a board-to-board connector, for example, as well as the board-equipped connector 42 and the connector 11 for aboard described above. In this case, the press-fit terminal 10 includes another press-fit part 19 instead of the mating part 16.

The press-fit terminal may be used in a form of a wire-equipped terminal that is connected to an electric wire without a connector.

It should be noted that the present invention is not limited to the above-described embodiments, and modifications, improvements, and the like within the scope that can achieve the object of the present invention are included in the present invention.

EXAMPLES

Hereinafter, the present invention will be described in detail using examples and comparative examples. However, the present invention is not limited to the description of these examples.

Examples and Comparative Examples

The press-fit terminals 10 having the shape described in Table 1, which is shown in FIG. 9, were produced, and their holding forces, contact areas, and insertion forces were measured. For each of the press-fit terminals 10, the width W1 of the press-fit terminal 10 was 1.2 mm. The width W2 of the eye hole 24 was 0.4 mm. The thickness of the press-fit terminal 10 was 0.64 mm.

(Holding Force)

The circuit board 12 having the through hole 17 with a diameter of 1.00 mm was prepared.

Figure 6:
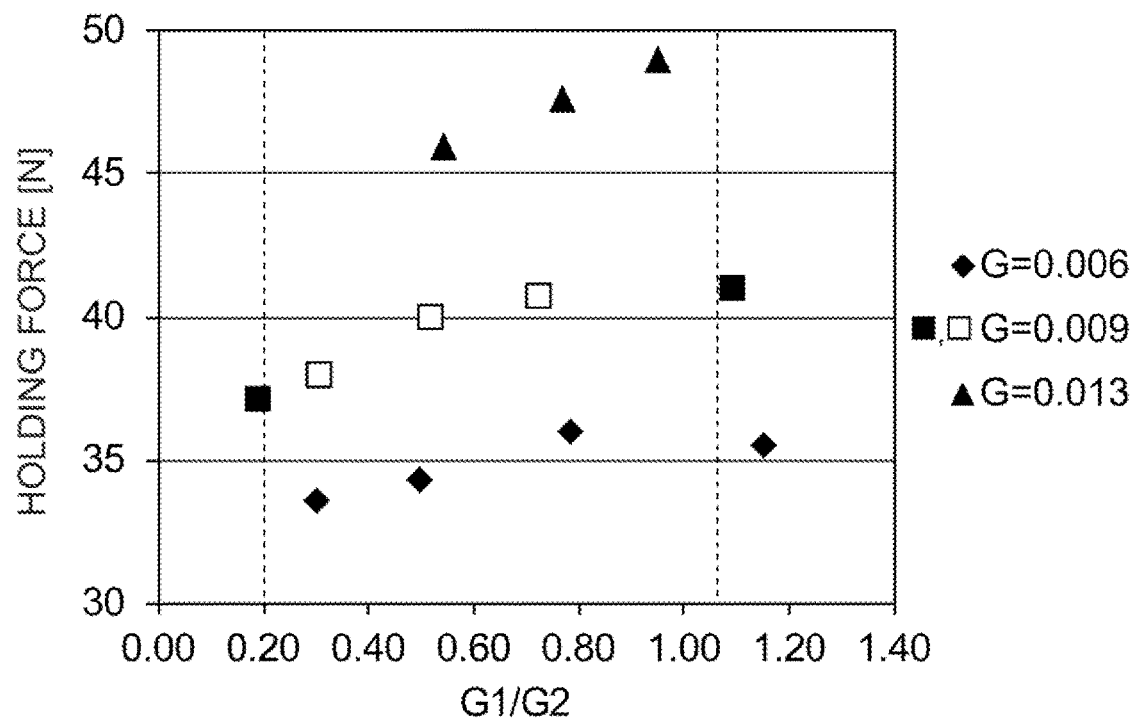
FIG. 6 shows holding forces of first to third examples and first to ninth comparative examples.

Each of the press-fit terminals 10 was inserted into the through hole 17 and the maximum value of the load [N] at the time of pulling out was measured to determine the holding force. FIG. 6 shows the measurement results of the holding forces of examples and comparative examples. In FIG. 6, white symbols indicate the examples, and black symbols indicate the comparative examples.

(Contact Area)

The circuit board 12 having the through hole 17 with a diameter of 1.00 mm was prepared.

Figure 7:
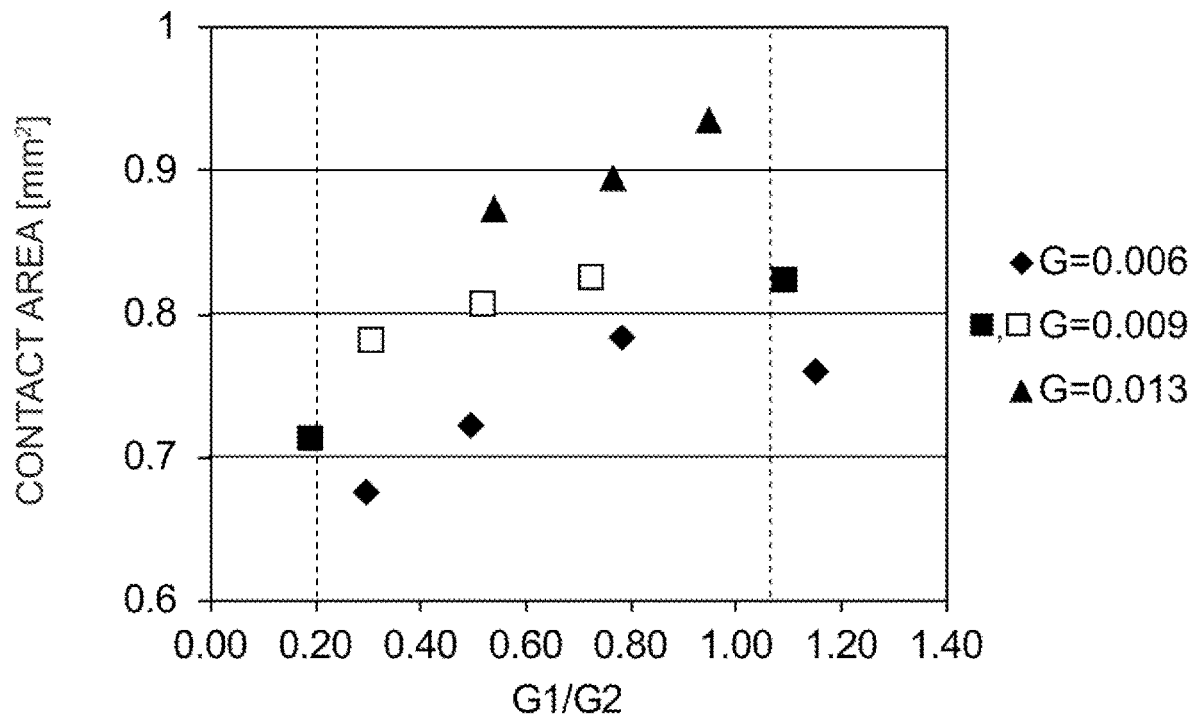
FIG. 7 shows contact areas of first to third examples and first to ninth comparative examples.

Each of the press-fit terminals 10 was inserted into the through hole 17, and the contact area between the inner surface of the through hole 17 and the press-fit terminal 10 was defined as contact area [mm$^2$]. FIG. 7 shows the measurement results of contact areas of the examples and the comparative examples. In FIG. 7, white symbols indicate the examples, and black symbols indicate the comparative examples.

(Insertion Force)

The circuit board 12 having the through hole 17 with a diameter of 1.00 mm was prepared.

Figure 8:
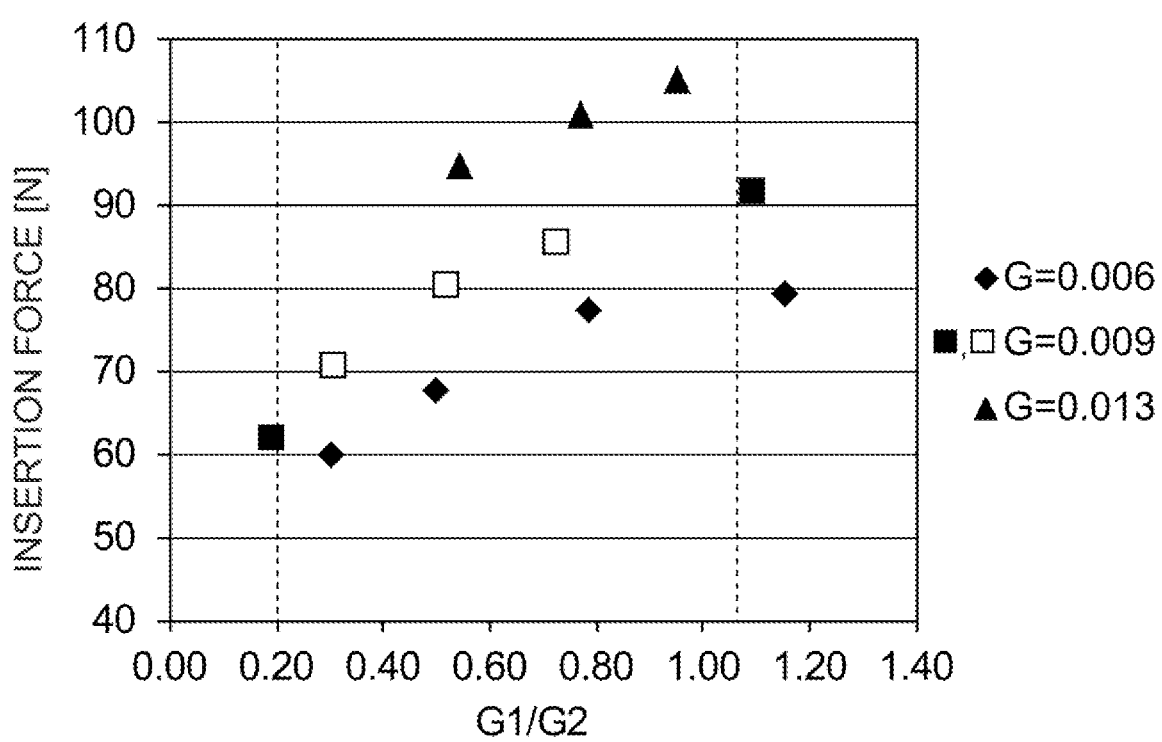
FIG. 8 shows insertion forces of first to third examples and first to ninth comparative examples.

Each of the press-fit terminals 10 was inserted into the through hole 17 and the maximum value of the load [N] at the time of insertion was measured to determine the insertion force. FIG. 8 shows the measurement results of the insertion forces of the examples and the comparative examples. In FIG. 8, white symbols indicate the examples, and black symbols indicate the comparative examples.

It has been confirmed that the press-fit terminals 10 of the examples can have a holding force of 37 N or more, a contact area of 0.72 mm$^2$ or more, and an insertion force of 90 N or less.

On the other hand, the first to fourth comparative examples had a holding force of less than 37 N.

The first to fifth comparative examples had a contact area of less than 0.72 mm$^2$.

The sixth to ninth comparative examples had an insertion force of more than 90 N.

It has been confirmed that, in the press-fit terminals of the examples, the circuits of the circuit board did not short-circuit even with a board-equipped connector at a pitch interval of 2.5 mm.

EXPLANATION OF SYMBOLS

10: Press-fit terminal
11: Connector for board
12: Circuit board
13: Connector
14: Hood part
15: Terminal press-fit hole
16: Mating part
17: Through hole
18: Conductive part
19: Press-fit part
20: Connecting part
21: Parallel part
22: Beam
24: Eye hole
25: Tapered part
40: Control unit
41: Case
42: Board-equipped connector
43: Boss
50: Front end of eye hole
51: Front reference
52: Rear end of eye hole
53: Rear reference
54: Intersection of perpendicular line $P_1$ and outer edge of beam
55: Straight line extending in the direction perpendicular to the perpendicular line $P_1$ from the intersection of the perpendicular line $P_1$ and the outer edge of the beam
56: A straight line extending along the outer edges of the parallel parts
57: Intersection of straight line 55 and straight line 56
58: Intersection of perpendicular line $P_2$ and outer edge of beam
59: A straight line extending in the direction perpendicular to the perpendicular line $P_2$ from the intersection of the perpendicular line $P_2$ and the outer edge of the beam
60: Intersection of straight line 59 and straight line 56

The invention claimed is:

1. A press-fit terminal that is to be press-fitted into a through hole formed in a circuit board comprising:
   a press-fit part includes a beam and an eye hole that is surrounded by the beam, the beam including two parallel parts that are parallel to each other, wherein in the press-fit part, $G_1/G_2$ is 0.20 or more and 1.05 or less where a front-side spring strength is $G_1$ mm³ and a rear-side spring strength is $G_2$ mm³ calculated under a plurality of conditions, and G is 0.007 mm³ or more and 0.012 mm³ or less where a spring strength G mm³ is $G_1+G_2$, the plurality of contitions including:

an insertion direction in which the press-fit terminal is inserted into the through hole is defined as a forward direction, and a direction opposite to the insertion direction is defined as a rear direction, a position 0.1 mm backward from a front end of the eye hole is defined as a front reference, and a position 0.1 mm forward from a rear end of the eye hole is defined as a rear reference, a length of a perpendicular line $P_1$ from the front reference to an outer edge of the beam is defined as a spring thickness $h_1$ mm, and a length of a perpendicular line $P_2$ from the rear reference to the outer edge of the beam is defined as a spring thickness $h_2$ mm, a thickness of the press-fit terminal at the front reference is defined as a plate thickness $t_1$ mm, and a thickness of the press-fit terminal at the rear reference is defined as a plate thickness $t_2$ mm, when the beam is viewed in cross section, an R chamfer of the outer edge of the beam has a radius r [mm], a second moment of area I of the front reference calculated by the following (equation) with t=$t_1$ and h=$h_1$ is defined as $I_1$ mm⁴, and a second moment of area I of the rear reference calculated by an equation in which t=$t_2$ and h=$h_2$ is defined as $I_2$ mm⁴, as follows:

$$I = \left(k - \frac{h-r}{2}\right)^2 t(h-r) + \frac{t(h-r)^3}{12} + \left[k - \left\{(h-r) + \frac{r}{2}\right\}\right]^2 (t-2r)r + \frac{(t-2r)r^3}{12} + \left[k - \left\{(h-r) + \frac{4r}{3\pi}\right\}\right]^2 \frac{\pi r^2}{2} + \frac{r^4(9\pi^2 - 64)}{72\pi}$$

$$\text{where } k = \frac{t(h-r)\frac{h-r}{2} + (t-r)r\left\{(h-r) + \frac{r}{2}\right\} + \frac{\pi r^2}{2}\left\{(h-r) + \frac{4r}{3\pi}\right\}}{(h-r)t + (t-2r)r + \frac{\pi r^2}{2}}$$

a length as seen in the insertion direction from an intersection of a straight line extended from an intersection of the perpendicular line $P_1$ and the outer edge of the beam in a direction perpendicular to the perpendicular line $P_1$ and a straight line extended along an outer edge of the parallel parts to the front end of the eye hole is defined as $L_1$ mm, a length as seen in the insertion direction from an intersection of a straight line extended from an intersection of the perpendicular line $P_2$ and the outer edge of the beam in a direction perpendicular to the perpendicular line $P_2$ and a straight line extended along an outer edge of the parallel parts to the rear end of the eye hole is defined as $L_2$ mm, and the front-side spring strength $G_1$ is defined as $I_1/L_1$ mm³, and the rear-side spring strength $G_2$ is defined as $I_2/L_2$ mm³.

2. The press-fit terminal according to claim 1, wherein the press-fit terminal is a press-fit terminal used for a signal system circuit.

3. The press-fit terminal according to claim 1, wherein the plate thickness $t_1$ is 0.5 mm or more and 0.7 mm or less, and the plate thickness $t_2$ is 0.5 mm or more and 0.7 mm or less.

4. The press-fit terminal according to claim 1, wherein the press-fit terminal has a thickness of 0.5 mm or more and 0.7 mm or less.

5. The press-fit terminal according to claim 1, wherein, of the press-fit part, a portion surrounding the eye hole is not chamfered.

6. The press-fit terminal according to claim 1, wherein $W_2/W_1$ is greater than 0.25 and 0.35 or less where a width of the press-fit part is $W_1$ mm and a width of the eye hole is $W_2$ mm.

7. The press-fit terminal according to claim 1, wherein a tip of the press-fit terminal has a tapered shape.

8. A connector for a board, the connector comprising:
the press-fit terminal according to claim 1; and
a connector in which the press-fit terminal is disposed.

9. The connector for a board according to claim 8, wherein a pitch interval of the press-fit terminal is greater than 2.0 mm and 3.0 mm or less.

10. The connector for a board according to claim 8, wherein $W_1/\varphi$ is 1.05 or more and 1.35 or less where a width of the press-fit part is $W_1$ mm and a diameter of the through hole is $\varphi$ mm.

11. The connector for a board according to claim 8, wherein a number of poles of the connector is 20 or more.

12. The connector for a board according to claim 8, wherein the connector for a board is used for a control unit.

13. A board-equipped connector comprising:
the connector for a board according to claim 8; and
a circuit board.

* * * * *